United States Patent
Hwang et al.

(10) Patent No.: US 6,699,738 B2
(45) Date of Patent: Mar. 2, 2004

(54) SEMICONDUCTOR DOPING METHOD AND LIQUID CRYSTAL DISPLAY DEVICE FABRICATING METHOD USING THE SAME

(75) Inventors: Eui-Hoon Hwang, Gyeonggi-Do (KR); Ki-Jong Kim, Seoul (KR)

(73) Assignee: LG. Phillips LCD Co., Ltd., Seoul (KR)

( * ) Notice: Subject to any disclaimer, the term of this patent is extended or adjusted under 35 U.S.C. 154(b) by 0 days.

(21) Appl. No.: 10/291,376

(22) Filed: Nov. 12, 2002

(65) Prior Publication Data
US 2003/0092224 A1 May 15, 2003

(30) Foreign Application Priority Data
Nov. 15, 2001 (KR) .......................... 2001-71123

(51) Int. Cl.[7] ........................ H01L 21/00; H01L 21/84
(52) U.S. Cl. ................................................. 438/149
(58) Field of Search ............................ 438/149, 150, 438/161, 166

(56) References Cited

U.S. PATENT DOCUMENTS 5,830,774 A * 11/1998 Klingbeil et al. ........... 438/672

* cited by examiner

*Primary Examiner*—Craig Thompson
(74) *Attorney, Agent, or Firm*—Morgan, Lewis & Bockius LLP

(57) ABSTRACT

A semiconductor doping method includes steps of forming an insulation layer on a substrate, forming a semiconductor layer on the insulation layer, forming a photoresist layer on the insulation layer, patterning the photoresist layer to provide a portion of the photoresist layer on a first portion of the semiconductor layer, hard baking the portion of the photoresist layer at a first hard-baking temperature of more than about 140° C., doping the semiconductor layer with an impurity in regions other than the first portion of the semiconductor layer, and removing the portion of the photoresist layer.

26 Claims, 19 Drawing Sheets

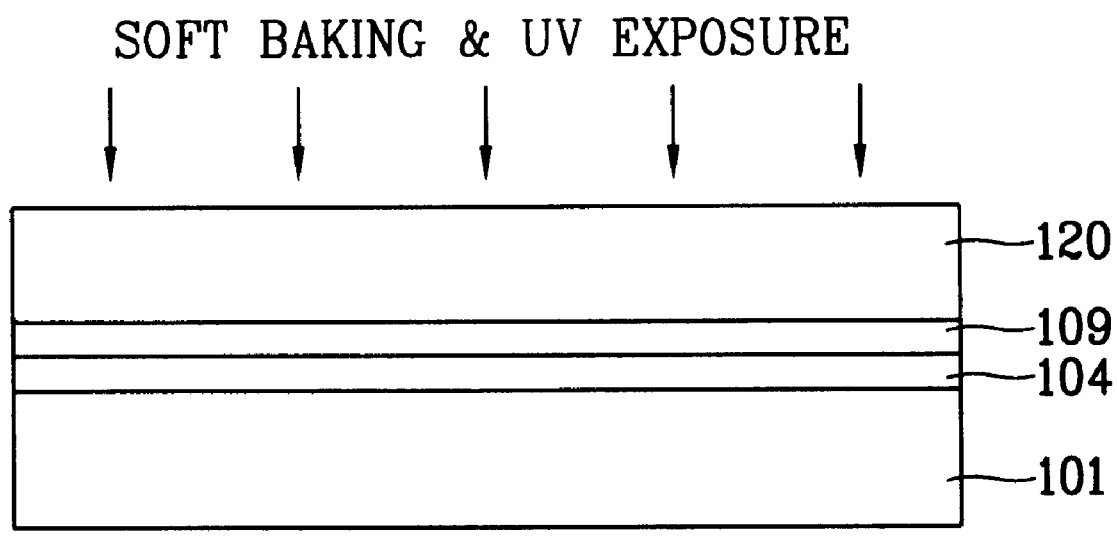

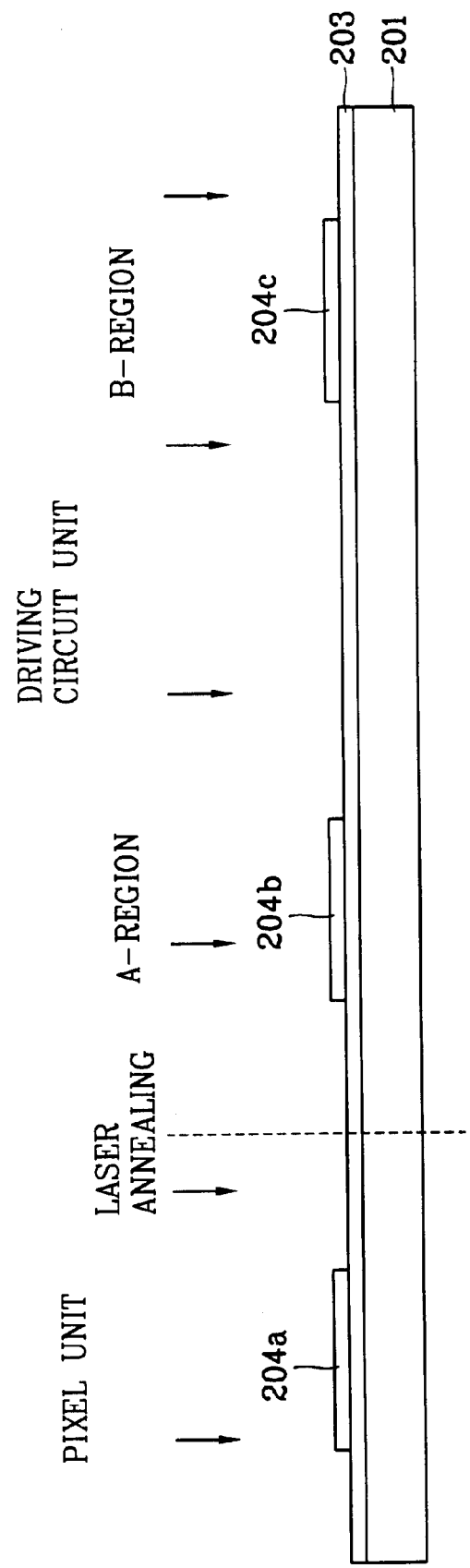

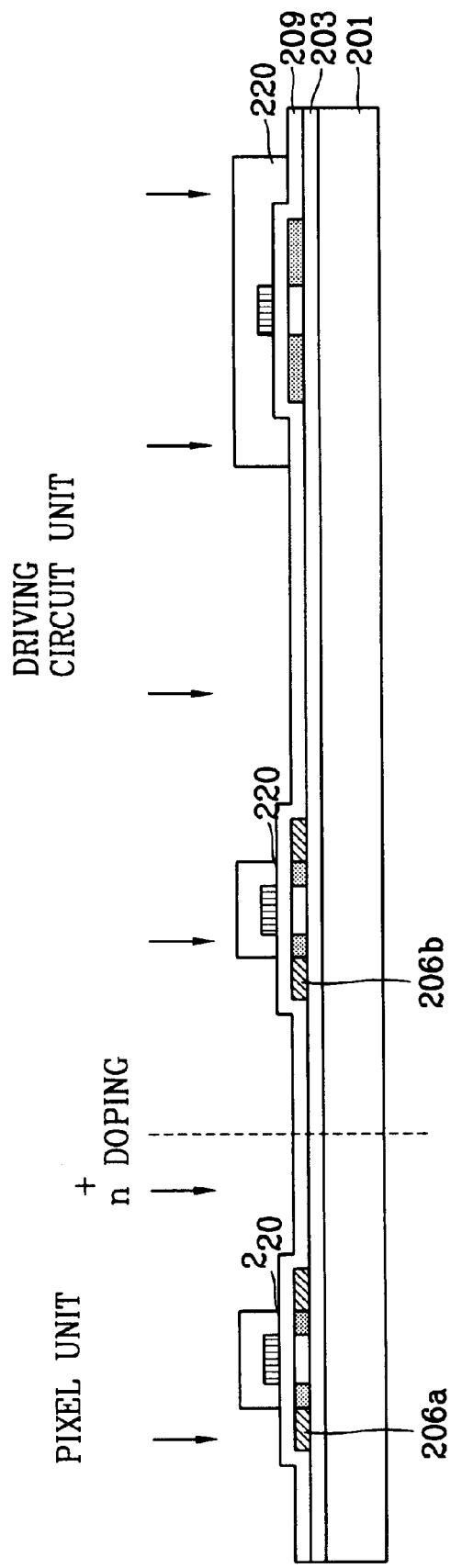

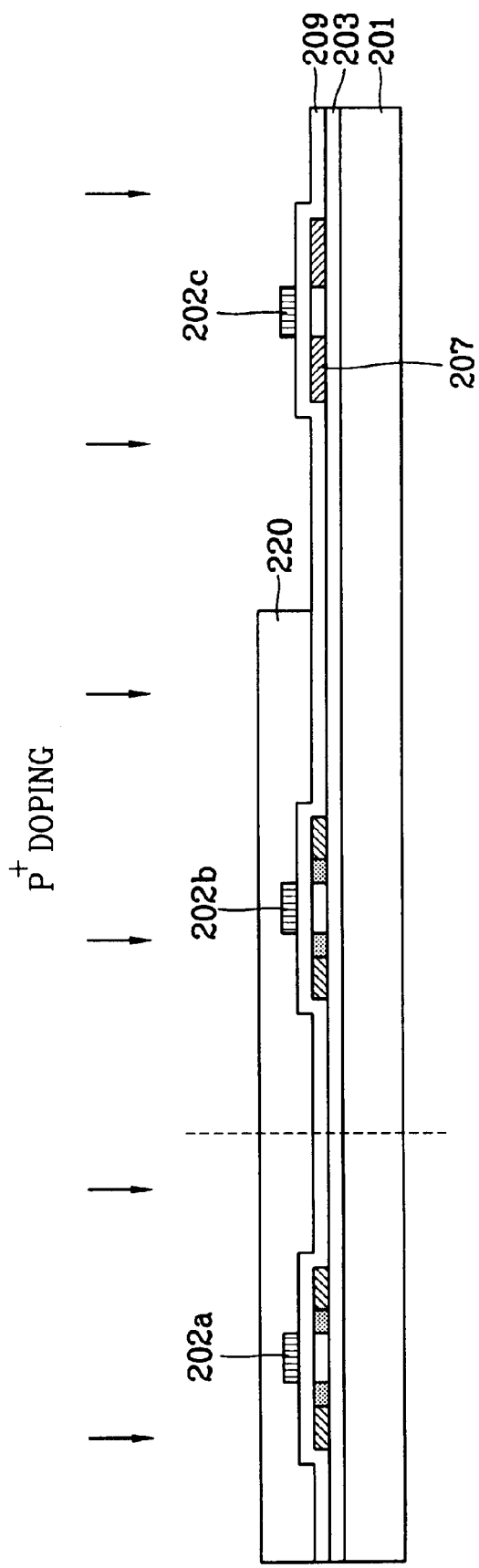

SEMICONDUCTOR DOPING METHOD AND LIQUID CRYSTAL DISPLAY DEVICE FABRICATING METHOD USING THE SAME

The present invention claims the benefit of Korean Patent Application No. 71123/2001 filed in Korea on Nov. 15, 2001, which is hereby incorporated by reference.

BACKGROUND OF THE INVENTION

1. Field of the Invention

The present invention relates to a semiconductor doping method, and more particularly, to a semiconductor doping method and a liquid crystal display device fabricating method using the same.

2. Description of the Related Art

Currently, active matrix liquid crystal display (LCD) devices are commonly used as large-scaled, high picture quality flat panel display devices, and include a pixel thin film transistor formed within each pixel for displaying an actual image and controlling liquid crystal molecules, and a driving circuit thin film transistor for applying a signal to a gate line and a data line to operate the pixel thin film transistor and applying a picture signal to a pixel electrode.

A driving circuit unit may be commonly divided into two types: an external signal driving circuit and an internal signal driving circuit. The external signal driving circuit is formed on an external substrate of a liquid crystal display panel, separately from a pixel driving TFT, and connected to the liquid crystal panel. The internal signal driving circuit is formed integrally with the pixel driving TFT on the liquid crystal display panel. A CMOS (Complimentary Metal Oxide Semiconductor) TFT that uses a polycrystalline silicon (p-Si) with a high junction field effect mobility is commonly used for the internal signal driving circuit. The internal signal driving circuit that uses the CMOS TFT is advantageous because fabrication costs may be reduced, switching effect is improved compared to an external driving type integrated circuit, and fabrication may be accomplished using the same processes for fabricating the pixel driving TFT.

FIG. 1 is a cross sectional view of a liquid crystal display device according to the related art. In FIG. 1, the liquid crystal display device is divided into a pixel unit in which liquid crystal molecules are aligned as an external signal is applied thereto, and a driving circuit unit for applying a signal to the pixel unit. The driving circuit unit includes a region "A" where an NMOS TFT is formed and a region "B" where a PMOS TFT is formed.

The NMOS TFT formed within the region "A" of the driving circuit unit and the pixel unit have an LDD (Light Doped Drain) structure that includes a buffer layer 3 stacked on a transparent glass substrate 1, intrinsic semiconductor layers (i.e., channel layers) 4a and 4b made of a p-Si, $n^-$ doped LDD layers 5a and 5b, and $n^+$ layers 6a and 6b formed on the buffer layer 3, a gate insulation layer 9 formed over the entire substrate 1 upon which the channel layers 4a and 4b, the LDD layers 5a and 5b, and the $n^+$ players 6a and 6b are formed, gate electrodes 2a and 2b formed at the channel layers 4a and 4b on the gate insulation layer 9, an interlayer 13 stacked throughout the entire substrate 1 upon which the gate electrode electrodes 2a and 2b are formed, source/drain electrodes 11a and 11b formed on the interlayer 13 and connected to the $n^+$ layers 6a and 6b through a via hole, and a passivation layer 15 stacked throughout the entire substrate with the TFT formed thereon. A pixel electrode 17 is formed on the passivation layer 15 of the pixel unit and is connected to the source/drain electrode 11a through a contact hole. The pixel electrode drives a liquid crystal material, thereby displaying image data when a signal is applied thereto.

The PMOS TFT formed at the region "B" of the driving circuit unit includes a buffer layer 3 stacked on a transparent glass substrate 1, a channel layer 4c and a $p^+$ layer 7 formed on the buffer layer 3, a gate insulation layer 9 stacked throughout the entire substrate 1 where the channel layer 4c and the $p^+$ layer 7 are formed, a gate electrode 2c formed at the region of the channel layer 4c on the gate insulation layer 9, an interlayer 13 stacked throughout the entire substrate 1 upon which the gate electrode 2c is formed, source/drain electrode 11a and 11b connected to the $p^+$ layer 7 through a contact hole, and a passivation layer 15 stacked throughout the entire substrate with the PMOS TFT formed thereon. The driving circuit CMOS TFT is integrally formed with the pixel TFT and applies a signal to the pixel TFT through the data line and the gate line.

In general, the NMOS TFT formed in the pixel unit and the driving circuit unit is completed by performing $n^+$ doping after the channel layer and the LDD layer are partially blocked by patterning the photoresist. In case of doping an n-type ion with a relatively big mass such as phosphor ion, the n-type ion penetrates into the photoresist, causing deformation of a chemical structure of the photoresist, thereby influencing display quality of the liquid crystal display device.

For the explanation of the doping phenomenon of the MOS TFT formed at the liquid crystal display device with the driving circuit integrally formed therewith, the MOS FET formed at both the pixel unit and the driving circuit unit is to be illustrated and explained. In this respect, however, considering that the NMOS FET is commonly formed at the pixel unit and the driving circuit unit, only the driving circuit unit will now be explained with omission of description for the pixel unit.

FIGS. 2A–2C are cross sectional views of an ion doping method according to the related art. In FIG. 2A, at regions "A" and "B" of the buffer layer 3 on the substrate 1, the semiconductor layer (not shown), the gate insulation layer 9 and the gate electrodes 2b and 2c are formed. When the LDD doping is performed, the gate electrodes 2b and 2c block the ion doping, thereby forming the channel layers 4b and 4c. Then, a low concentration of n-type ions is doped at both sides of the channel layers 4b and 4c, thereby forming the LDD layers 5b and 5c.

In FIG. 2B, a photoresist layer 20 is formed at a portion of the LDD layer 5b and over the entire region "B" to block a portion of the LDD layer 5b and the region "B." In general, patterning of a photoresist material is completed by soft baking the coated photoresist at a temperature of about 100° C., and photocured by irradiating an ultraviolet light onto the soft baked photoresist material. Then, a high dose of n-type ions are implanted thereon with a high acceleration energy.

In FIG. 2C, the portion of the LDD layer 5b of the region "A" is changed to an $n^+$ layer 6b, and the photoresist layer is removed. Then subsequent processing, such as interlayer, source/drain, and passivation processes are performed to complete the NMOS TFT of the LDD structure. Although not shown in the drawings, the LDD layer 5c of the region "B" is changed to a PMOS TFT according to a $p^+$ doping.

In the driving circuit integrated liquid crystal panel, in order to form the NMOS TFT of the pixel unit and the NMOS TFT of the driving circuit unit, in a state that a portion of the semiconductor layer is blocked, the high dose of n-type ions uses a high acceleration energy. Since the phosphor is the commonly selected n-type ion used for the n⁺ doping and has a relatively large mass, if the high dose/high acceleration energy is performed, the n-type ions penetrate into the photoresist layer, thereby deforming the chemical structure of the photoresist material. The chemical deformation of the photoresist material changes a reaction with a developer, thereby making it impossible to completely strip the photoresist layer 20 after doping. As a result, portions of the photoresist material remain on the gate insulating layer 9, thereby generating defects in the TFT.

FIGS. 3A–3C are cross sectional views of another ion doping method according to the related art. In FIG. 3A, an LDD doping is performed to form the channel layers 4b and 4c and LDD layers 5b and 5c on semiconductor layers of the regions "A" and "B." Then, as shown in FIG. 3B, the gate insulation layer 9 is entirely etched except for a portion of below the gate electrodes 2b and 2c. Subsequently, after a photoresist material is coated, a photoresist layer 20 is formed at a portion of the LDD layer 5b of the region "A" and throughout the entire region of "B" through soft baking, exposure, and development processes. Then, in a state that a portion of the LDD layer 5b and the region "B" are blocked, the n-type ion is doped thereon using a low acceleration energy. Next, a portion of the LDD layer 5b is changed to the n⁺ layer 6b according to the n-type doping, thereby completing an NMOS TFT of the LDD structure including the LDD layer 5b and the n⁺ layer 6b.

Although the gate insulation layer 9 is stripped, except for the portion below the gate electrode 2b and 2c, even in a case where only the gate insulation layer 9 above the n-type doping region is etched, n-type doping can be performed with a low acceleration energy. In this method, since the gate insulation layer 9 does not exist at the doping region, the n-type ion can be doped with a low acceleration energy. Consequently, the amount of n-type ions penetrating into the photoresist material is reduced, thereby preventing chemical deformation of the photoresist material. Thus, during etching of the photoresist material after the doping process, no residual photoresist remains on the gate insulation layer 9. However, in this method, etching the gate insulation layer 9 is an additional process step, thereby increasing fabrication costs and generating contact defects between the semiconductor layer and the source/drain electrodes following formation of the semiconductor layer. Accordingly, the semiconductor layer in the region "B" is damaged when the gate insulation layer 9 is etched.

SUMMARY OF THE INVENTION

Accordingly, the present invention is directed to a semiconductor doping method and liquid crystal display device fabricating method using the same that substantially obviates one or more of the problems due to limitations and disadvantages of the related art.

An object of the present invention is to provide a semiconductor doping method in which a photoresist material may be completely removed without any residual material.

Another object of the present invention is to provide a polycrystalline thin film transistor fabricating method adopting the semiconductor doping method.

Another object of the present invention is to provide a liquid crystal display device fabricating method adopting the semiconductor doping method.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a semiconductor doping method includes steps of forming an insulation layer on a substrate, forming a semiconductor layer on the insulation layer, forming a photoresist layer on the insulation layer, patterning the photoresist layer to provide a portion of the photoresist layer on a first portion of the semiconductor layer, hard baking the portion of the photoresist layer at a first hard-baking temperature of more than about 140° C., doping the semiconductor layer with an impurity in regions other than the first portion of the semiconductor layer, and removing the portion of the photoresist layer.

In another aspect, a polycrystalline thin film transistor fabricating method includes steps of forming an insulation layer on a substrate, forming an amorphous semiconductor layer on the insulation layer, crystallizing the amorphous semiconductor layer to form a polycrystalline semiconductor layer, forming a gate insulation layer on entire surface of the substrate and the polycrystalline semiconductor layer, forming a gate electrode on the gate insulation layer, forming a photoresist layer on the gate electrode, patterning the photoresist layer to provide a portion of the photoresist layer on a first portion of the polycrystalline semiconductor layer, baking the photoresist layer at a first temperature of more than about 140° C., doping the polycrystalline semiconductor layer with an impurity at a first concentration in regions other than the first portion of the polycrystalline semiconductor layer to form a channel layer and an impurity semiconductor layer, removing the photoresist layer, forming an insulation layer on the gate electrode and gate insulation layer, and forming source/drain electrodes in electrical contact with the impurity semiconductor layer on the insulation layer; and forming a passivation layer on the source/drain electrodes and insulation layer.

In another aspect, a method of fabricating a liquid crystal display device with a driving circuit integrally formed therewith includes steps of forming a buffer layer on a pixel unit and first and second regions of a driving circuit unit of a first substrate, forming an amorphous semiconductor layer on the buffer layer, crystallizing the amorphous semiconductor layer to form a polycrystalline semiconductor layer, forming a gate insulation layer on entire surface of the buffer layer and the polycrystalline semiconductor layer, doping the polycrystalline semiconductor layer to form a channel region and lightly doped drain regions, forming a photoresist layer on entire surface of the gate insulation layer, patterning the photoresist layer to form a first photoresist layer over the lightly doped drain regions formed in the pixel unit and a first region of the driving circuit unit, and over a second region of the driving circuit unit, baking the first photoresist layer at a first temperature of more than about 140° C., doping a portion of the lightly doped drain regions formed in the pixel unit and the first region of the driving circuit unit to form first impurity semiconductor regions, removing the first photoresist layer, forming a second photoresist layer over the pixel unit and the first region of the driving circuit unit, doping the lightly doped drain regions in the second region of the driving circuit unit with a second impurity to form second impurity semiconductor regions, removing the second photoresist layer, forming an interlayer on an entire surface of the gate insulation layer, forming a plurality of via holes exposing portions of the first and second impurity semiconductor regions, forming a metal layer on the interlayer and within the plurality of via holes to form pairs of source/drain electrodes in electrical contact with exposed portions of the first and second impurity semiconductor regions, and forming at least one passivation layer on an entire surface of the interlayer and the pairs of source/drain electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 4A–4E are cross sectional views of an exemplary ion doping method according to the present invention; and FIGS. 5A–5G are cross sectional views of an exemplary fabrication method of a liquid crystal display device according to the present invention.

DETAILED DESCRIPTION OF THE PREFERRED EMBODIMENTS

Reference will now be made in detail to the preferred embodiments of the present invention, examples of which are illustrated in the accompanying drawings.

Figure 1:
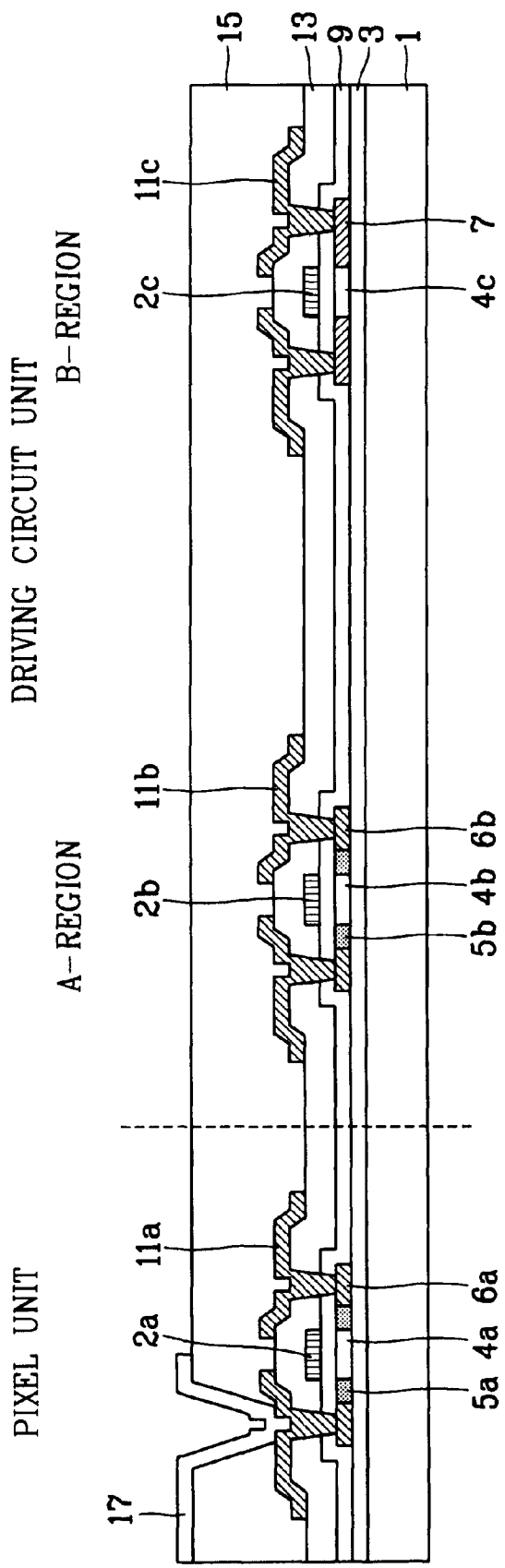
FIG. 1 is a cross sectional view of a liquid crystal display device according to the related art.
Figure 2A:
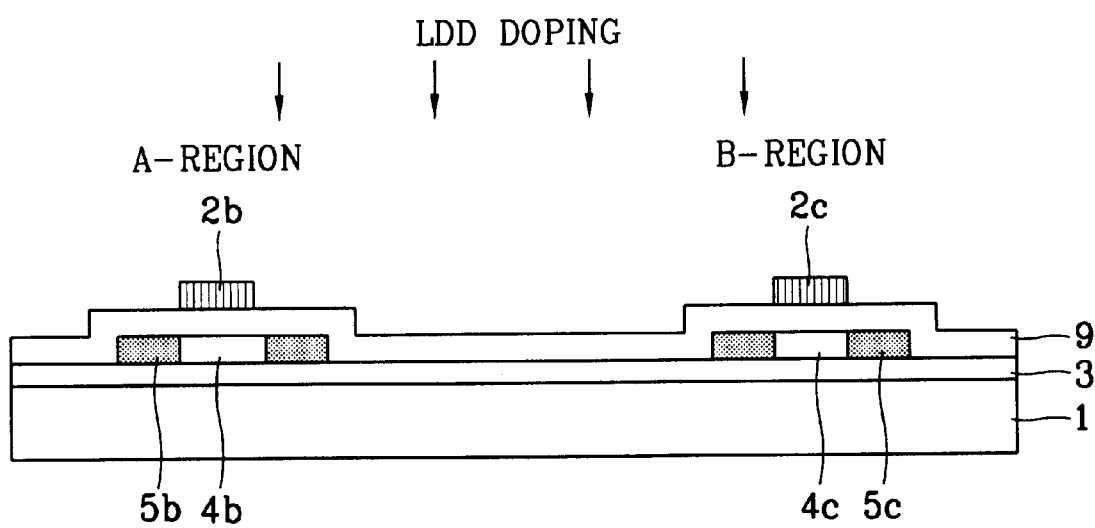
FIGS. 2A–2C are cross sectional views of an ion doping method according to the related art.
Figure 2B:
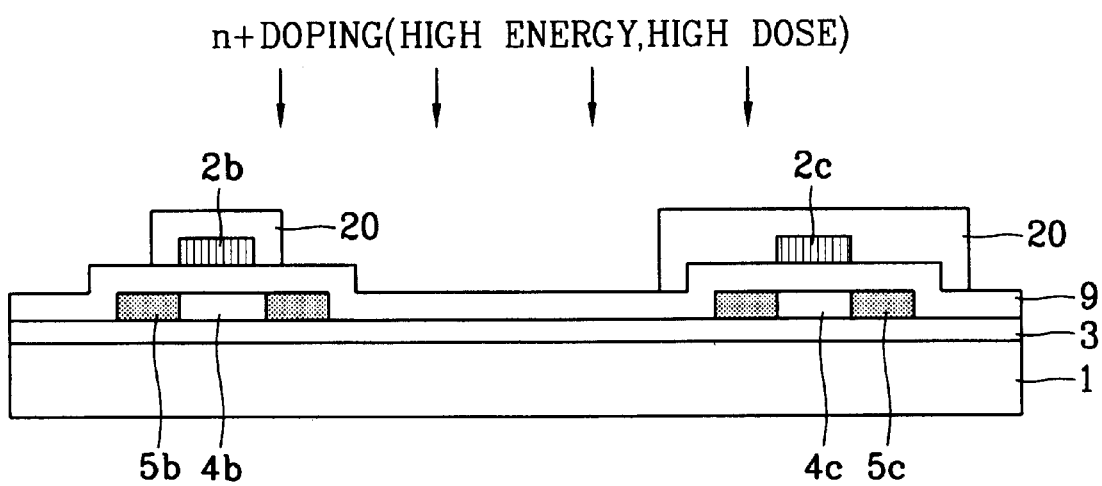
Figure 2C:
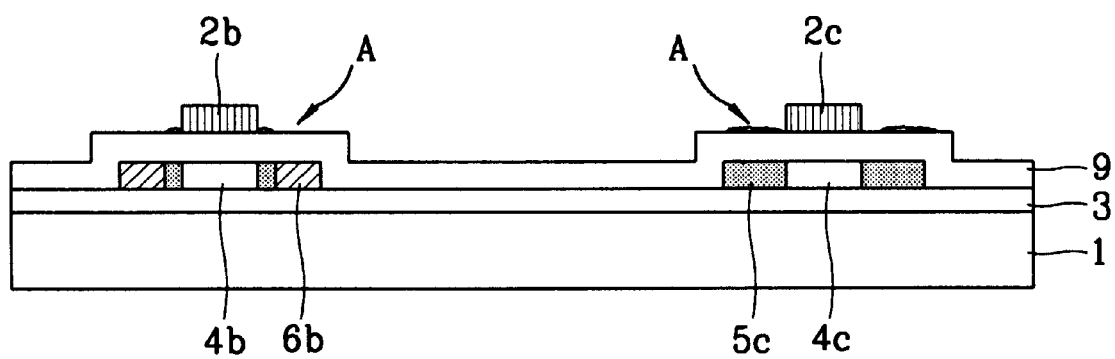
Figure 3A:
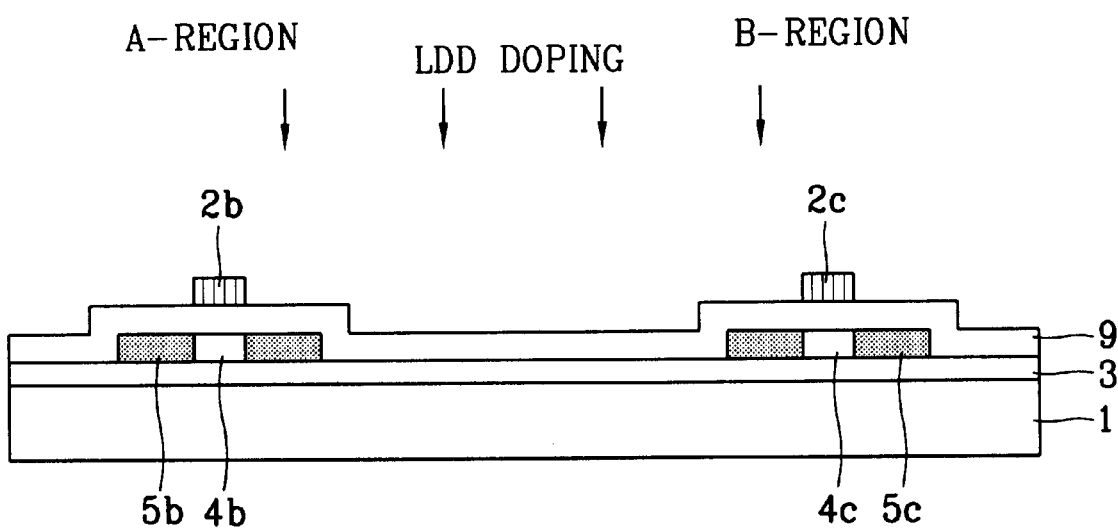
FIGS. 3A–3C are cross sectional views of another ion doping method according to the related art.
Figure 3B:
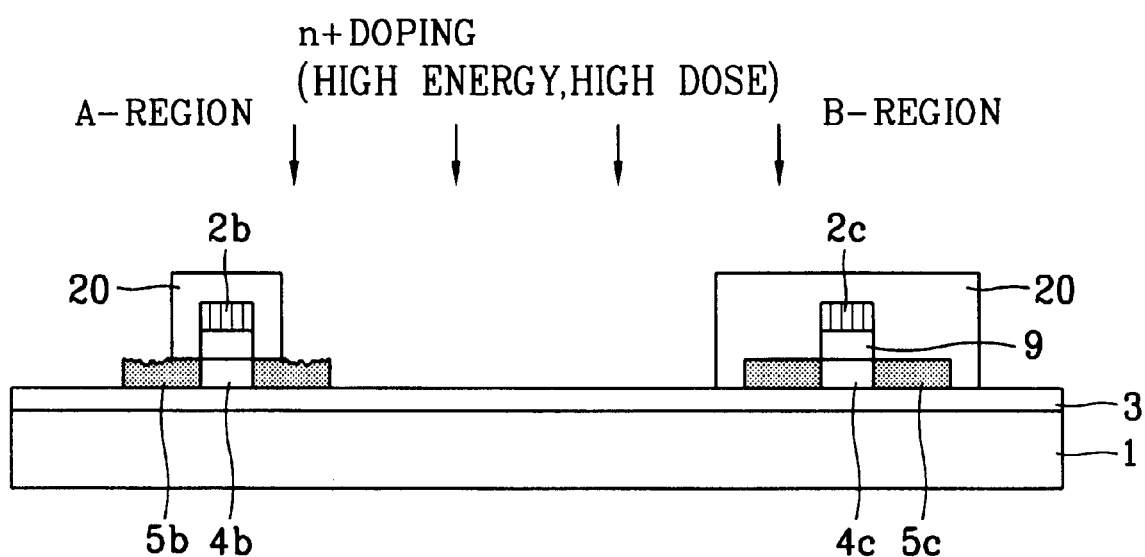
Figure 3C:
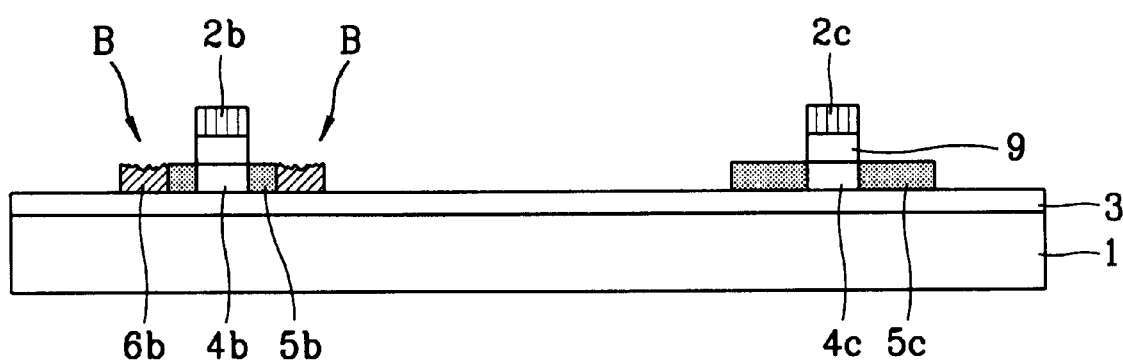
Figure 4A:
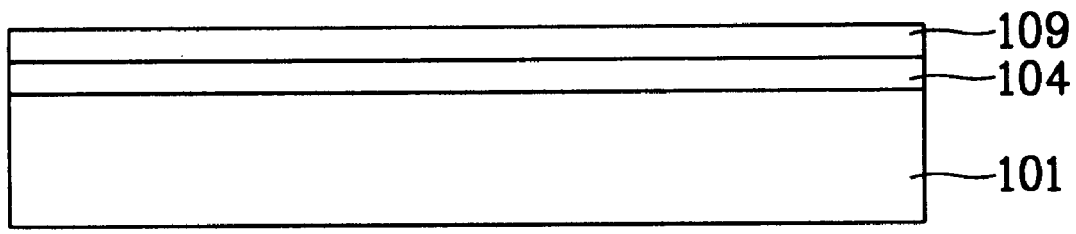

FIGS. 4A–4E are cross sectional views of an exemplary ion doping method according to the present invention. In FIG. 4A, an insulation layer 109 may be formed on a semiconductor layer 104 that is formed on a substrate 101, which may include glass or an insulating material.

In FIG. 4B, a photoresist material may be coated on the insulation layer 109, thereby forming a photoresist layer 120. In general, a negative photoresist and a positive photoresist may be used. However, the negative photoresist preferably may be used. The photoresist material is soft-baked at a temperature of about 100° C., and ultraviolet light may be irradiated onto the soft-baked photoresist material.

Figure 4C:
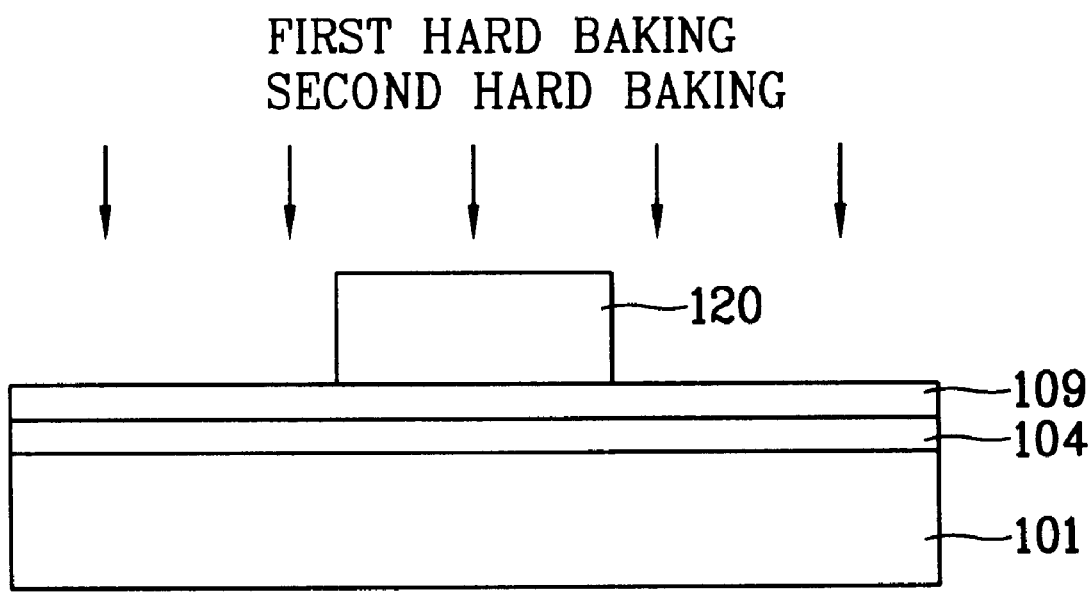

In FIG. 4C, the irradiated, soft-baked photoresist material may be developed, thereby forming a patterned photoresist layer 120. The photoresist layer 120 may be hard-baked twice, wherein each hard-baking may be performed at different temperatures. For example, during the first hard-baking, the photoresist layer 120 may be thermally treated at a temperature of about 130° C., and during the second hard-baking, the photoresist layer 120 may be thermally treated at a higher temperature of about 140–165° C., or preferably at a temperature of about 150–155° C. Alternatively, the first hard-baking process may be omitted.

Figure 4D:
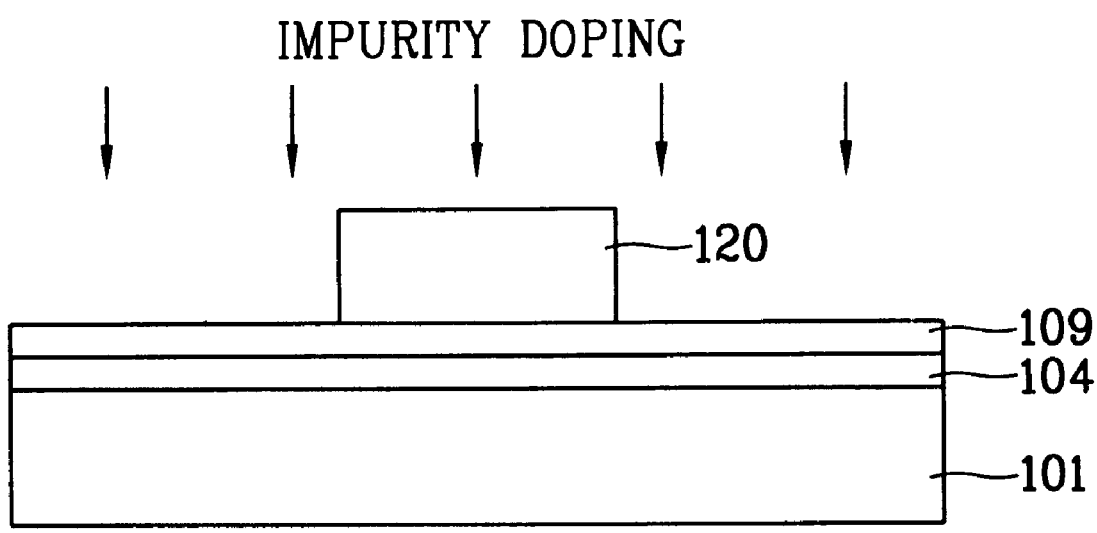

In FIG. 4D, an impurity may be doped on the entire substrate with a high acceleration energy.

Figure 4E:
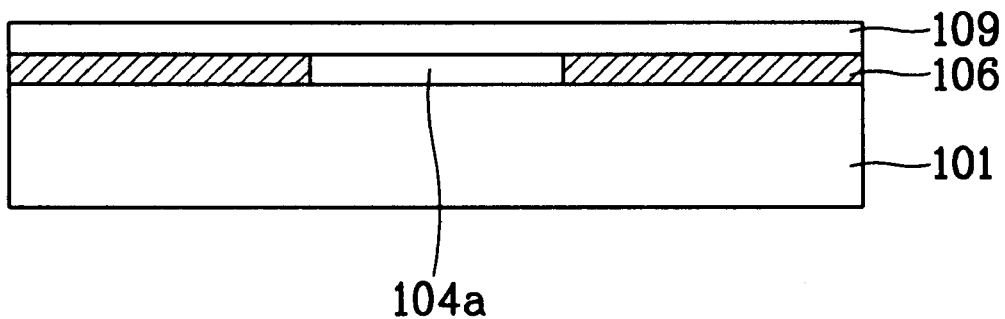

In FIG. 4E, wherein a portion of the semiconductor layer 104 that is blocked by the photoresist layer 120 may be changed to a channel layer 104a and a portion of the semiconductor layer 104 doped with the impurity thereon at both sides may become an impurity layer 106. The impurity may be an n-type ion, such as a phosphor ion, or a p-type ion, such as a boron ion. However, since the p-type ion, such as boron ion, has a relatively lower mass than the n-type phosphor ion, it may be difficult to cause chemical deformation of the photoresist layer even when the photoresist layer is not formed using the first and second hard-baking processes. Accordingly, the method in the present invention may be adopted to the n-type doping.

Since the first hard-baking process is performed at about 130° C. and the second hard-baking process is performed at about 140° C., more cross-linking is formed due to the higher temperature within the photoresest layer. Accordingly, a more firm photoresist layer may be formed. This, even in the case that the n-type ion is doped using a high acceleration energy, the photoresist layer will not be chemically deformed by the n-type ion and the photoresist layer may be completely etched.

Accordingly, the n-type doping using a high dose/high acceleration energy may be adapted to doping of a semiconductor substrate (i.e., semiconductor wafer) as well as to doping of a semiconductor layer formed on a glass substrate. The doping method according to the present invention may be adopted to fabrication of various semiconductor devices, such as general p-Si TFTs or p-Si CMOS TFTs. Since the liquid display device with an external driving circuit formed integrally therewith of the present invention includes both the p-Si TFT and the p-Si CMOS TFT, descriptions on the liquid crystal display device would show adoption of the present invention to the p-Si TFT and p-Si CMOS TFT.

FIGS. 5A–5G are cross sectional views of an exemplary fabrication method of a liquid crystal display device according to the present invention. In FIGS. 5A–5G, the substrate may be divided into a pixel unit where an NMOS TFT may be formed and a driving circuit unit where a CMOS TFT may be formed. The driving circuit unit may be divided into a region "A" where the NMOS TFT may be formed and a region "B" where a PMOS TFT may be formed.

In FIG. 5A, a buffer layer 203 may be formed on a substrate 201. The buffer layer may include an insulating material, such as $SiO_2$, and the substrate 201 may include a transparent material, such as glass. Then, an amorphous semiconductor, such as a-Si, may be deposited within the pixel unit and the regions "A" and "B" of the driving circuit unit of the buffer layer 203, and patterned to form amorphous semiconductor layers 204a, 204b and 204c. Subsequently, the amorphous semiconductor layers 204a, 204b, and 204c may be laser-annealed to form a polycrystalline semiconductor layer (a p-Si layer). The laser annealing may be performed by a method in which the amorphous semiconductor layer is scanned with an excimer laser. The deposited amorphous semiconductor may be first laser-annealed to be changed to a polycrystalline semiconductor, and then the polycrystalline semiconductor may be patterned to form the semiconductor layers 204a, 204b, and 204c.

Figure 5B:
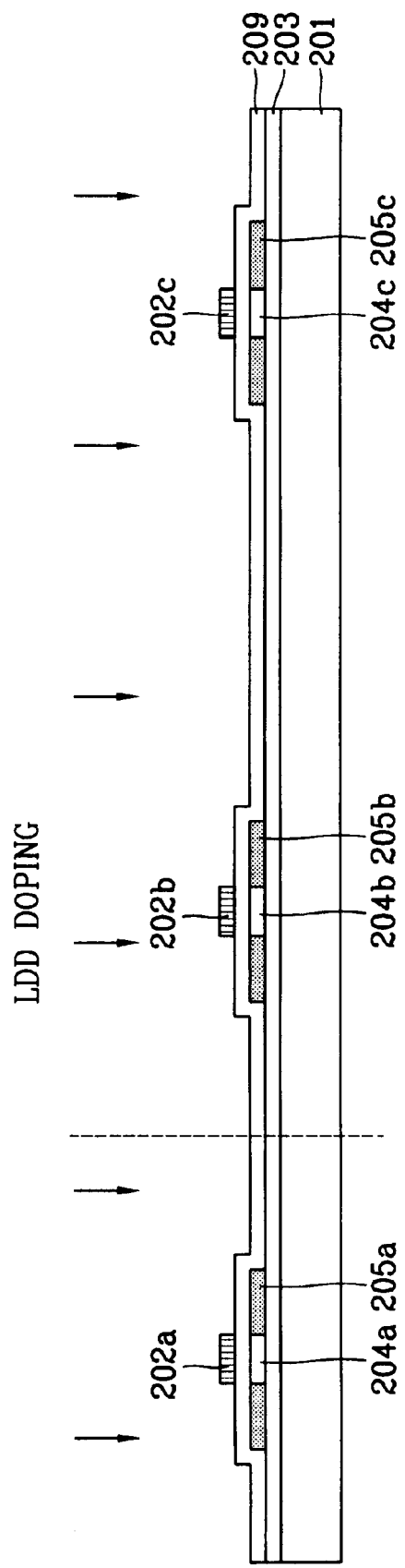

In FIG. 5B, an insulating material, such as $SiO_2$ or SiNx, may be stacked over the entire substrate 210 to a thickness of about 1800 Å to form a gate insulation layer 209. Then, gate electrodes 202a, 202b, and 202c may be formed on the gate insulation layer 209 of the pixel unit and the regions "A" and "B" of the driving circuit unit. The gate electrodes 202a, 202b, and 202c may be formed as a single metal layer, or may be formed as a double metal layer, thereby improving film and current characteristics. For example, the gate electrodes 202a, 202b, and 202c may include AlNd/Mo, wherein an AlNd layer and a Mo layer may be sequentially deposited to a thickness of about 3000 Å and about 500 Å, respectively, over the entire gate insulation layer 209. Then, the AlNd and Mo layers may be simultaneously patterned within the pixel unit and the regions "A" and "B" of the driving circuit unit. The gate electrodes 202a, 202b, and 202c may block the n ions during the LDD doping process. Accordingly, the n-type ions may be doped on the semiconductor layer by the LDD doping, so that channel layers 204a, 204b, and 204c and low concentration LDD layers 205a, 205b, and 205c may be respectively formed at the semiconductor layer of the pixel unit and the driving circuit unit.

Figure 5C:
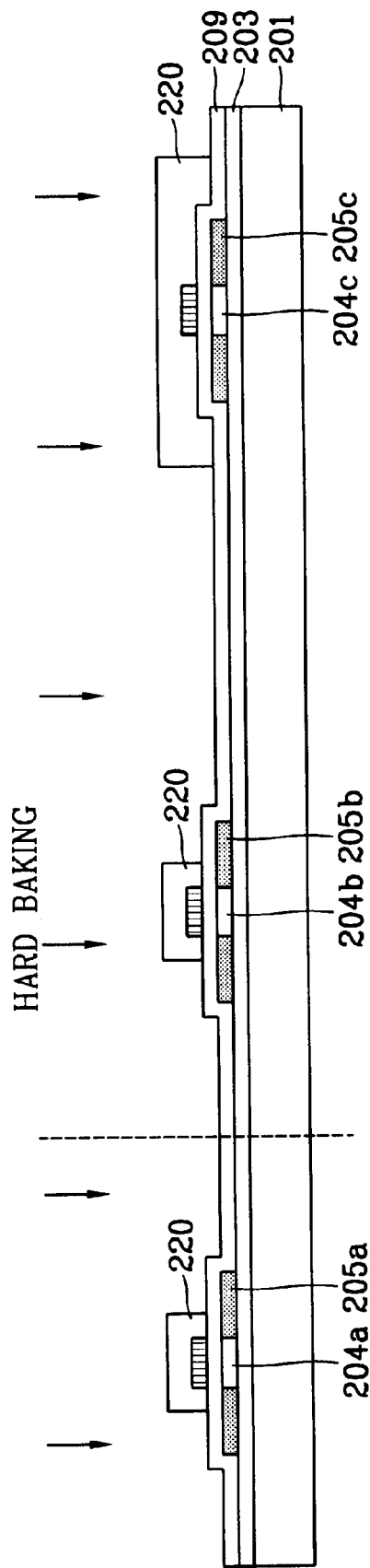

In FIG. 5C, a photoresist material may be coated throughout the entire substrate 201 and patterned to form a first photoresist layer 220. The photoresist material may be a negative photoresist, and the first photoresist layer 220 may be formed by processes including coating the photoresist material, soft-baking at about 100° C., exposure and development, and performing a first hard-baking. Alternatively, the first hard-baking process may be omitted. Accordingly, the first photoresist layer 220 may be formed to cover the LDD layers 205a and 205b formed at the pixel unit and the region "A" of the driving circuit unit, and may be formed to entirely cover the region "B" of the driving circuit unit. Then, the first photoresist layer 220 may be thermally treated during a second hard-baking process. The second hard-baking process may be performed at a temperature range of about 140–165° C., and preferably at a temperature range of about 150–155° C., for about 1 minute. Accordingly, if the second hard-baking temperature is above 165° C., carbon may be driven from the photoresist material, thereby causing chemical deformation of the photoresist material. Thus, it may be preferred not to exceed 165° C. during the second hard-baking process. The second hard-baking increases cross-linking within the photoresist material, thereby forming the first photoresist layer 220 having a more chemically firm structure.

The first photoresist layer 220 may be formed during a single hard-baking process. For example, by thermally treating the photoresist at about 150–155° C. during the first hard-baking process, the photoresist layer 220 may be firmly formed without the second hard-baking process.

In FIG. 5D, a high dose and acceleration energy of n-type doping may be performed on the substrate with the first photoresist layer 220 formed thereon. Accordingly, a relatively high concentration of n-type ions may be doped into the LDD layers 205a and 205b of the pixel unit to form $n^+$ layers 206a and into the "A" region of the driving circuit unit that have not been blocked by the first photoresist layer 220, thereby forming $n^+$ layers 206b.

In FIG. 5E, the first photoresist layer 220 may be etched, and a second photoresist layer 220 may be formed over the entire portion of the pixel unit and the "A" region of the driving circuit unit. The second photoresist layer 220 may also be formed through photoresist coating, soft-baking (at about 100° C.), exposing, developing, and hard-baking (at about 130° C.) processes.

Since boron ions used for the p-type doping to form the PMOS TFT of the driving circuit unit have a relatively lower mass compared to the mass of phosphor ions, the photoresist would be hardly deformed by doping. Therefore, the second hard-baking process for the first and second photoresist layer 220 may not be necessary for the p-type doping. As the p-type doping is performed on the substrate with the second photoresist layer 220 formed thereon, a high concentration of p-type ions may be doped into the LDD layer 205c of the "B" region of the driving circuit unit, thereby forming a $p^+$ layer 207.

Figure 5F:
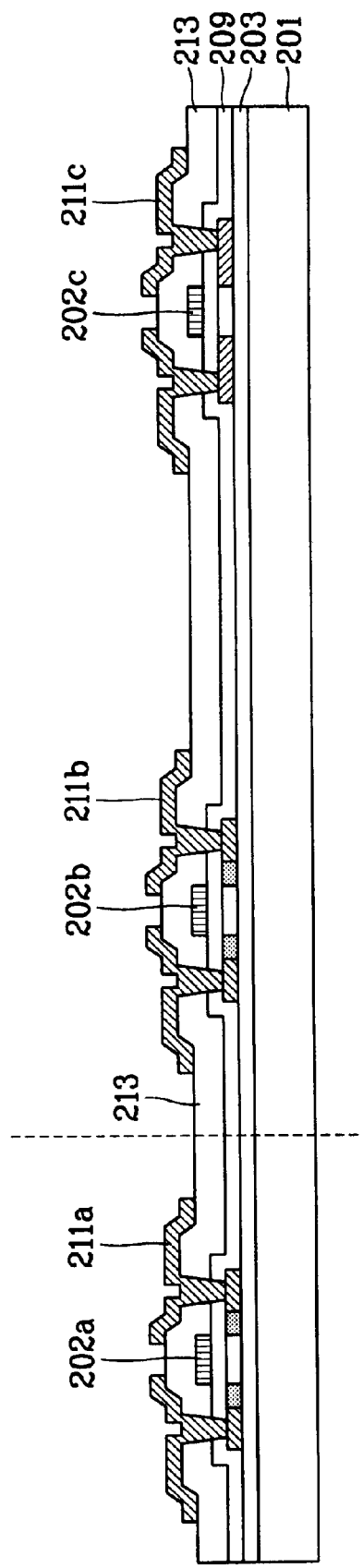

In FIG. 5F, the second photoresist layer 220 may be removed, and an interlayer 213 may be formed on the gate insulation layer 209. Then, via holes may be formed in the gate insulation layer 209 and the interlayer 213 to form pairs of source/drain electrodes 211a, 211b, and 211c to electrically contact the $n^+$ layers 206a and 206b and the $p^+$ layer 209. The interlayer 213 may be formed by depositing SiNx material to a thickness of about 7000 Å, and the pairs of source/drain electrodes 211a, 211b, and 211c may be formed by stacking and patterning the AlNd/Mo layer.

Figure 5G:
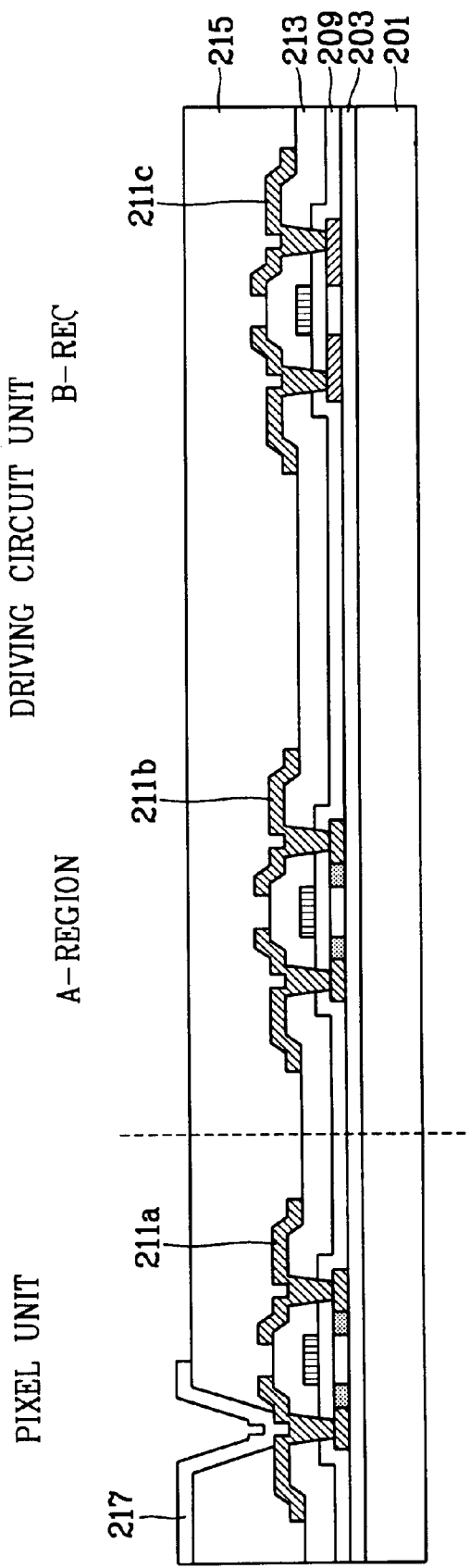

In FIG. 5G, a passivation layer 215 may be formed over the entire substrate 201, and may include benzocyclobutene (BCB) to provide an improved aperture ratio and planarization. Then, a pixel electrode 217 that may include a conductive transparent material, such as an ITO (Indium Tin Oxide), may be formed within the pixel unit to be electrically connected to one of the source/drain electrode pair 211a through one of the via holes previously formed in the gate insulation layer 209 and the interlayer 213. Although the passivation layer 215 is shown as a single layer in FIG. 5G, the passivation layer 215 may be formed of a plurality of individual layers. For example, the passivation layer may be formed of a first layer that includes an inorganic material, such as SiNx, and a second layer that includes an organic material, such as BCB.

In addition, although not explicitly shown in the drawings, a light shielding member may be formed by separate processes at a substrate region to prevent light leakage to the color filter layer. Then, the substrate 201 and another substrate may be sealed by a sealing material, into which liquid crystal material is injected, thereby completing a liquid crystal display device.

It will be apparent to those skilled in the art that various modifications and variations can be made in the semiconductor doping method and liquid crystal display device fabricating method using the same of the present invention without departing from the spirit or scope of the invention. Thus, it is intended that the present invention cover the modifications and variations of this invention provided they come within the scope of the appended claims and their equivalents.

What is claimed is:

1. A semiconductor doping method, comprising the steps of:

forming a first insulation layer on a substrate;

forming a semiconductor layer on the first insulation layer;

forming a second insulation layer on the semiconductor layer;

forming a photoresist layer on the second insulation layer;

patterning the photoresist layer to provide a portion of the photoresist layer on a first portion of the semiconductor layer;

hard baking the portion of the photoresist layer at a first hard-baking temperature of more than about 140° C.;

doping the semiconductor layer with an impurity in regions other than the first portion of the semiconductor layer; and removing the portion of the photoresist layer.

2. The method according to claim 1, wherein the impurity includes n-type ions.

3. The method according to claim 1, wherein the step of patterning the photoresist comprises:

coating a photoresist material onto the semiconductor layer;

thermally treating the photoresist material to a soft-baking temperature;

exposing the baked photoresist material to light;

developing the exposed photoresist material; and thermally treating the developed photoresist material to a second hard-baking temperature.

4. The method according to claim 3, wherein the soft-baking temperature is about 100° C.

5. The method according to claim 3, wherein the second hard-baking temperature is about 130° C.

6. The method according to claim 1, wherein the first hard-baking temperature is about 140–165° C.

7. The method according to claim 6, wherein the first hard-baking temperature is about 150–155° C.

8. A polycrystalline thin film transistor fabricating method, comprising the steps of:

forming an insulation layer on a substrate;

forming an amorphous semiconductor layer on the insulation layer;

crystallizing the amorphous semiconductor layer to form a polycrystalline semiconductor layer;

forming a gate insulation layer on entire surface of the substrate and the polycrystalline semiconductor layer;

forming a gate electrode on the gate insulation layer;

forming a photoresist layer on the gate electrode;

patterning the photoresist layer to provide a portion of the photoresist layer on a first portion of the polycrystalline semiconductor layer;

baking the photoresist layer at a first temperature of more than about 140° C.;

doping the polycrystalline semiconductor layer with an impurity at a first concentration in regions other than the first portion of the polycrystalline semiconductor layer to form a channel layer and an impurity semiconductor layer;

removing the photoresist layer;

forming an insulation layer on the gate electrode and gate insulation layer;

forming source/drain electrodes in electrical contact with the impurity semiconductor layer on the insulation layer; and forming a passivation layer on the source/drain electrodes and insulation layer.

9. The method according to claim 8, wherein the step of patterning the photoresist comprises:

coating a photoresist material on the gate insulation layer;

thermally treating the photoresist material at a second temperature;

exposing the soft-baked photoresist material to light;

developing the exposed photoresist material; and thermally treating the developed photoresist material at a third temperature.

10. The method according to claim 9, wherein the second temperature is about 100° C.

11. The method according to claim 9, the third temperature is about 130° C.

12. The method according to claim 8, wherein the first temperature is about 140–165° C.

13. The method according to claim 12, wherein the first temperature is about 150–155° C.

14. The method according to claim 8, further comprising the step of doping the impurity semiconductor layer to a second impurity concentration on the to form light doped drain regions.

15. The method according to claim 8, wherein the step of forming a polycrystalline semiconductor layer includes the step of scanning a laser beam on the amorphous semiconductor layer.

16. A method of fabricating a liquid crystal display device with a driving circuit integrally formed therewith, comprising the steps of:

forming a buffer layer on a pixel unit and first and second regions of a driving circuit unit of a first substrate;

forming an amorphous semiconductor layer on the buffer layer;

crystallizing the amorphous semiconductor layer to form a polycrystalline semiconductor layer;

forming a gate insulation layer on entire surface of the buffer layer and the polycrystalline semiconductor layer;

doping the polycrystalline semiconductor layer to form a channel region and lightly doped drain regions;

forming a photoresist layer on entire surface of the gate insulation layer;

patterning the photoresist layer to form a first photoresist layer over the lightly doped drain regions formed in the pixel unit and a first region of the driving circuit unit, and over a second region of the driving circuit unit;

baking the first photoresist layer at a first temperature of more than about 140° C.;

doping a portion of the lightly doped drain regions formed in the pixel unit and the first region of the driving circuit unit to form first impurity semiconductor regions;

removing the first photoresist layer;

forming a second photoresist layer over the pixel unit and the first region of the driving circuit unit;

doping the lightly doped drain regions in the second region of the driving circuit unit with a second impurity to form second impurity semiconductor regions;

removing the second photoresist layer;

forming an interlayer on an entire surface of the gate insulation layer;

forming a plurality of via holes exposing portions of the first and second impurity semiconductor regions;

forming a metal layer on the interlayer and within the plurality of via holes to form pairs of source/drain electrodes in electrical contact with exposed portions of the first and second impurity semiconductor regions; and forming at least one passivation layer on an entire surface of the interlayer and the pairs of source/drain electrodes.

17. The method according to claim 16, wherein the step of forming a polycrystalline semiconductor layer includes laser-scanning the amorphous semiconductor layer.

18. The method according to claim 16, wherein the first impurity includes n-type ions.

19. The method according to claim 16, wherein the second impurity includes p-type ions.

20. The method according to claim 16, wherein the step of forming a first photoresist layer comprises:

coating a photoresist material on the gate insulation layer;

thermally treating the photoresist material at a second temperature;

exposing the soft-baked photoresist material to light;

developing the exposed photoresist material; and thermally treating the developed photoresist material at a third temperature.

21. The method according to claim 20, wherein the first temperature is about 100° C.

22. The method according to claim 20, the third temperature is about 130° C.

23. The method according to claim 16, wherein the first temperature is about 140–165° C.

24. The method according to claim 23, wherein the first temperature is about 150–155° C.

25. The method according to claim 16, wherein the passivation layer includes at least one of an inorganic passivation layer and an organic passivation layer.

26. The method according to claim 16, further comprising steps of:

providing a second substrate having a color filter layer and a shielding unit;

bonding the first and second substrates together; and injecting a liquid crystal material between the bonded first and second substrates.

* * * * *